US011509328B2

(12) United States Patent
Carrie et al.

(10) Patent No.: US 11,509,328 B2
(45) Date of Patent: Nov. 22, 2022

(54) COMPUTER DATA COMPRESSION UTILIZING MULTIPLE SYMBOL ALPHABETS AND DYNAMIC BINDING OF SYMBOL ALPHABETS

(71) Applicant: Microsoft Technology Licensing, LLC, Redmond, WA (US)

(72) Inventors: Susan Elizabeth Carrie, Mountain View, CA (US); George Easton Scott, III, Seattle, WA (US); Ravi Shankar Kolli, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 826 days.

(21) Appl. No.: 15/995,071

(22) Filed: May 31, 2018

(65) Prior Publication Data
US 2019/0372590 A1    Dec. 5, 2019

(51) Int. Cl.
*H03M 7/00*     (2006.01)
*H03M 7/30*     (2006.01)

(52) U.S. Cl.
CPC .................. *H03M 7/3084* (2013.01)

(58) Field of Classification Search
CPC ...... H03M 7/3086; H03M 7/40; H03M 13/05; H03M 7/00; H03M 7/3066; H03M 7/3088;
(Continued)

(56) References Cited

U.S. PATENT DOCUMENTS 5,502,439 A * 3/1996 Berlin .................... G06T 9/005
                                                      341/106
6,266,628 B1 * 7/2001 Huep .................... G01C 21/16
                                                       33/290
(Continued)

FOREIGN PATENT DOCUMENTS

EP          2637407 A1     9/2013

OTHER PUBLICATIONS

Gopal, et al., "High Performance DEFLATE Compression on Intel Architecture Processors", In White Paper of IA Architects Intel Corporation, Nov. 1, 2011, 15 Pages.
(Continued)

*Primary Examiner* — Linh V Nguyen

(57) ABSTRACT

The generation of symbol-encoded data from digital data, as part of the compression of the digital data into a compressed digital data, can be performed with reference to multiple alternative alphabets. A selection of a specific alphabet is made based on the digital data being compressed, the compression parameters, or combinations thereof. Information indicative of the selected alphabet is encoded into one or more headers of the resulting compressed digital data. A single alphabet can be selected for all of a set of digital data being compressed, or multiple different alphabets can be selected, with different ones of the multiple different alphabets being utilized to compress different portions of the digital data. Additionally, rather than explicitly specifying a specific selected alphabet, the header information can comprise information from which a same alphabet can be independently selected heuristically by both the compressor and the corresponding decompressor.

20 Claims, 6 Drawing Sheets

(58) Field of Classification Search
CPC .. H03M 7/4037; H03M 7/4093; H03M 7/425; H03M 7/6005; H03M 7/6094; H03M 7/70; H03M 7/707
USPC .................................. 341/51–54, 59, 65, 106
See application file for complete search history.

(56) References Cited

U.S. PATENT DOCUMENTS

| | | | |
|---|---|---|---|
| 6,320,522 B1* | 11/2001 | Satoh | H03M 7/40 341/51 |
| 9,473,168 B1* | 10/2016 | Gopal | H03M 7/3086 |
| 2002/0063641 A1* | 5/2002 | Fish | H03M 7/3086 341/87 |
| 2009/0060047 A1* | 3/2009 | Schneider | H03M 7/40 375/240.23 |
| 2009/0112897 A1* | 4/2009 | Ordentlich | H03M 7/40 |
| 2010/0225506 A1* | 9/2010 | Chen | H03M 7/48 341/51 |
| 2012/0169518 A1 | 7/2012 | Wang et al. | |
| 2013/0021179 A1 | 1/2013 | Jaquette | |
| 2014/0289208 A1* | 9/2014 | Itani | H03M 7/3086 707/693 |
| 2015/0358031 A1 | 12/2015 | Wu et al. | |
| 2016/0085555 A1* | 3/2016 | Gopal | H03M 7/3091 711/125 |
| 2016/0112064 A1* | 4/2016 | Dalton | H03M 7/42 341/106 |

OTHER PUBLICATIONS

"International Search Report and Written Opinion Issued in PCT Application No. PCT/US2019/032332", dated Sep. 3, 2019, 15 Pages.

"Canonical Huffman code", Retrieved From https://en.wikipedia.org/wiki/Canonical_Huffman_code, Retrieved on: Nov. 17, 2017, 4 Pages.

Deutsch, P., "RFC 1951—DEFLA I E Compressed Data Format Specification version", Retrieved From http://www.faqs.org/rfcs/rfc1951.html, May 1996, 17 Pages.

Huffman, David A., "A Method for the Construction of Minimum Redundancy Codes", In Proceedings of the Institute of Radio Engineers, vol. 40, Issue 9, Sep. 1952, pp. 1098-1101.

Ziv, et al., "A Universal Algorithm for Sequential Data Compression", In Journal of IEEE Transactions on Information Theory, vol. 23, No. 3, May 1977, pp. 337-343.

* cited by examiner

COMPUTER DATA COMPRESSION UTILIZING MULTIPLE SYMBOL ALPHABETS AND DYNAMIC BINDING OF SYMBOL ALPHABETS

BACKGROUND

While modern computer-readable storage media continue to increase in storage capacity, it can remain desirable to compress computer-readable digital data in a lossless manner such that the lossless compression thereof enables the digital data to be stored utilizing less computer-readable storage capacity while simultaneously enabling the digital data to be uncompressed to its original and unmodified form for subsequent reading, editing and utilization thereof. One mechanism by which computer-readable digital data can be compressed is to first convert the digital data into symbol-encoded digital data, where sequences of bits of digital data that occurred previously in the digital data are replaced with a symbol that represents an offset-length pair, with the offset identifying how far back in the digital data that same sequence of bits previously occurred, and the length identifying the length of the sequence itself. Subsequently, as part of the compression of the digital data, the symbol-encoded digital data is frequency encoded to generate the actual compressed version of the digital data itself. Such frequency encoding can replace the aforementioned symbols with shorter codes that represent the symbols, in essence utilizing a shorthand to convey the same information with less digital data.

The generation of the symbol-encoded digital data is based on a single predefined alphabet. That single predefined alphabet defines all of the symbols that can be utilized in generating the symbol-encoded digital data. If the alphabet comprises too few symbols, then the amount of compression that can be achieved can be less. For example, if the alphabet does not comprise a single symbol that identifies a specific offset and length, then multiple symbols will have to be used. By contrast, if the alphabet did comprise a single symbol representing the specific offset and length, such a single symbol could be utilized, thereby enabling the second instance to achieve a better compression of the digital data.

However, frequency encoding requires that the alphabet be encoded in the header of the resulting compressed digital data. Consequently, while a larger alphabet can comprise symbols that can be utilized to replace greater quantities of bits with a single symbol, such a larger alphabet can also result in a larger header, thereby increasing the size of the resulting compressed digital data and negating some of the storage space benefits of the compression. As can be seen, trade offs exist in the size of the alphabet. Unfortunately, the alphabet utilized by compression algorithms is fixed and cannot be changed, resulting in the above-described inefficiencies.

SUMMARY

The generation of symbol-encoded data from digital data, as part of the compression of the digital data into a compressed digital data, can be performed with reference to multiple alternative alphabets. A selection of a specific alphabet can be made based on the digital data being compressed, the compression parameters, or combinations thereof. The digital data being compressed can inform the alphabet selection in that sequences of bits that cannot occur in the data need not be represented in the alphabet, nor need symbols representing offset-length pairs that cannot occur, either due to the size of the digital data itself or due to the compression parameters, such as the size of a window utilized to find prior instances of the same sequences of bits within the digital data. In a similar manner, the ability of alphabet symbols to be represented by smaller quantities of bits in a shorthand form resulting from a frequency encoding can further inform the selection of a specific alphabet, as can the ability of symbols of an alphabet to be moved to lower hierarchical levels within the alphabet to achieve such smaller shorthand forms. Information indicative of the selected alphabet can be encoded into one or more headers of the resulting compressed digital data. A single alphabet can be selected for all of a set of digital data being compressed, or multiple different alphabets can be selected, with different ones of the multiple different alphabets being utilized to compress different portions of the digital data. In instances where multiple different alphabets are utilized, alphabet information can be encoded into headers of individual portions of the resulting compressed digital data. Additionally, rather than explicitly specifying a specific selected alphabet, the header information can comprise information from which an alphabet can be independently selected heuristically by the compressor from a set of alphabets known to the decompressor. The selection of the alphabet can then be placed into the header for use by the corresponding decompressor. Such information can be expressed in a bit vector specifying the existence, or lack thereof, of specific alphabet selection factors which can inform the heuristic selection of the alphabet.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
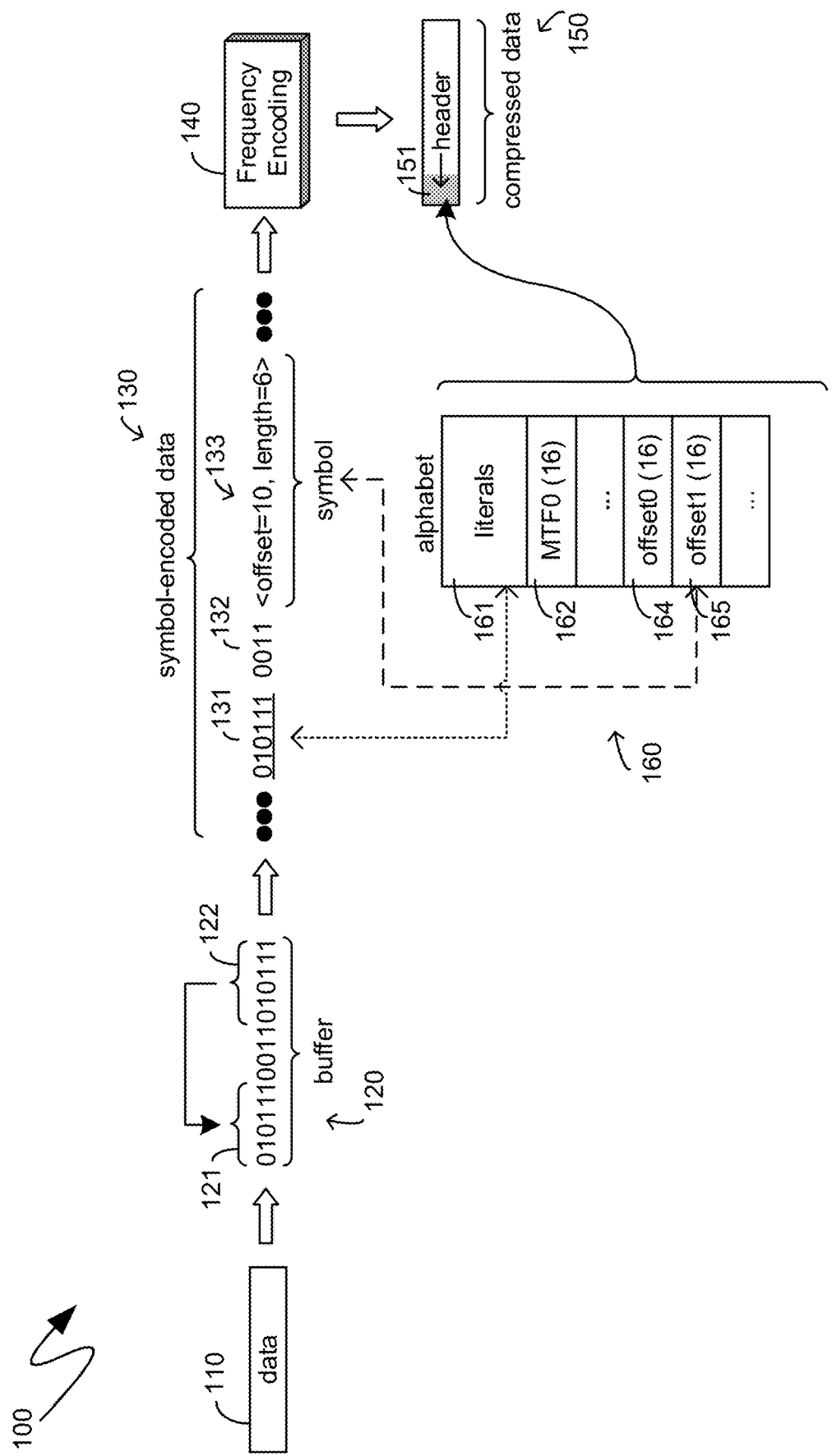
FIG. 1 is a system diagram of an exemplary compression of digital data.

The following description relates to enabling the dynamic selection of one or more alphabets for compressing digital data at compression time. The generation of symbol-encoded data from digital data, as part of the compression of the digital data into a compressed digital data, can be performed with reference to multiple alternative alphabets. A selection of a specific alphabet at compression time can be made based on the digital data being compressed, the compression parameters, or combinations thereof. The digital data being compressed can inform the alphabet selection in that sequences of bits that cannot occur in the data need not be represented in the alphabet, nor need symbols representing offset-length pairs that cannot occur, either due to the size of the digital data itself or due to the compression parameters, such as the size of a window utilized to find prior instances of the same sequences of bits within the digital data. In a similar manner, the ability of alphabet symbols to be represented by smaller quantities of bits in a shorthand form resulting from a frequency encoding can further inform the selection of a specific alphabet, as can the ability of symbols of an alphabet to be moved to lower hierarchical levels within the alphabet to achieve such smaller shorthand forms. Information indicative of the selected alphabet can be encoded into one or more headers of the resulting compressed digital data. A single alphabet can be selected for all of a set of digital data being compressed, or multiple different alphabets can be selected, with different ones of the multiple different alphabets being utilized to compress different portions of the digital data. In instances where multiple different alphabets are utilized, alphabet information can be encoded into headers of individual portions of the resulting compressed digital data or into headers associated with all of a set of digital data. In yet another aspect, an initial alphabet can be selected an encoded into one or more headers of one or more portions of data which were compressed utilizing such an initial alphabet. If a subsequent portion of the data was compressed with a different alphabet, the difference between the initial alphabet and the different alphabet can be encoded into the header of the portion compressed with the different alphabet. For example, headers of subsequent portions of the data can specify different symbols that were moved to lower hierarchical levels of the alphabet for purposes of compressing those subsequent portions of the data. Additionally, rather than explicitly specifying a specific selected alphabet, the header information can comprise information from which an alphabet can be independently selected heuristically by the compressor from a set of alphabets known to the decompressor. The selection of the alphabet can then be placed into the header for use by the corresponding decompressor. Such information can be expressed in a bit vector specifying the existence, or lack thereof, of specific alphabet selection factors which can inform the heuristic selection of the alphabet.

Although not required, the description below will be in the general context of computer-executable instructions, such as program modules, being executed by a computing device. More specifically, the description will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Additionally, the description below is equally applicable to implementation, in part or in whole, in hardware processing units, such as Field Programmable Gate Arrays (FPGAs) or other customized hardware circuitry that is specifically designed to perform the mechanisms described below. To the extent that steps or aspects of the below-described mechanisms are not implemented via dedicated processing circuitry, they can be implemented in computer-executable instructions that interact with such dedicated processing circuitry in manners well known to those skilled in the art.

Generally, program modules include routines, programs, objects, components, data structures, and the like that perform particular tasks or implement particular abstract data types. Moreover, those skilled in the art will appreciate that the computing devices need not be limited to conventional personal computers, and include other computing configurations, including servers, hand-held devices, multi-processor systems, microprocessor based or programmable consumer electronics, network PCs, minicomputers, mainframe computers, and the like. Similarly, the computing devices need not be limited to stand-alone computing devices, as the mechanisms may also be practiced in distributed computing environments where tasks are performed by remote processing devices that are linked through a communications network. In a distributed computing environment, program modules may be located in both local and remote memory storage devices.

With reference to FIG. 1, an exemplary system 100 is illustrated, providing context for the descriptions below. The system 100 of FIG. 1 illustrates an exemplary compression of digital data, such as the exemplary data 110. As shown, portions of the data 110 can be read into a buffer, such as the exemplary buffer 120. Within the buffer 120, portions of the data that are repeated can be replaced with references to prior instances of that same data. For example, the exemplary portion 121, is illustrated as comprising the bit sequence "010111". That same bit sequence is then repeated subsequently in the exemplary portion 122, as also illustrated. Consequently, the portions 121 and 122 can be replaced with alphabet symbols as part of an intermediate step in the exemplary compression of the digital data 110.

More specifically, the portion 121 can be replaced by a symbol 131 from the exemplary alphabet 160 that literally represents the bit sequence "010111". Such a symbol can be one of a set of symbols often referred to as "literals", such as the exemplary literals 161 that are shown as being part of the exemplary alphabet 160. The symbol 132 can, similarly, also be one of the literals 161. The literals 161 can comprise a bit sequences of a same quantity of bits, or of differing quantities of bits. For example, the literals 161 can comprise common bit sequences, such as, for example, the bit sequences corresponding to ASCII textual characters.

The exemplary alphabet 160 can comprise other symbols, which, rather than directly representing a specific bit sequence, can, instead, represent an offset-length pair, where the offset can specify a quantity of bits further back in the data at which a current bit sequence occurred, and the length can specify the quantity of bits that comprise the previously occurring bit sequence. For example, the exemplary symbol 133 can represent an offset of ten bits and a length of six bits. While processing the buffer 120, the exemplary data compression illustrated by the exemplary system 100 of FIG. 1 can detect that the bit sequence of the data portion 122 that is currently being processed occurred previously within the buffer 120, namely as the data portion 121. Thus, when replacing the data portion 122 with a symbol from the exemplary alphabet 160, a symbol can be selected, such as the exemplary symbol 133, that specifies that the data portion 121 started ten bits previously to the start of the data portion 122 and that for a length of six bits the data portion 121 was identical to the data portion 122. Consequently, the data portion 122 can be replaced with a reference to the data portion 121 without any loss of data. Such a reference can be in the form of an offset-length pair, such as that detailed previously, represented by the symbol 133 of the exemplary alphabet 160.

For purposes of illustration, the exemplary alphabet 160 is illustrated as comprising multiple different sets of symbols, including the literals 161 described previously. Symbols representing offset-length pairs can be identified in groupings that are indicative of an additional quantity of bits that should be read to identify the offset. For example, the exemplary set 164 can comprise symbols identifying offset-length pairs whose offset is "1", since "0" additional bits are needed to be read to identify such an offset. The parenthetical "16" can further specify that within the exemplary set 164, there can be sixteen different offset-length pairs, each with an offset of "1", and each with a different length, such that the lengths identified by the offset-length pairs of the exemplary set 164 are sequentially continuous. For example, if the exemplary data compression shown by the exemplary system 100 of FIG. 1 utilizes a minimum length of three bits, such that previously occurring sequences of bits of less than three bits are not referenced by offset-length pairs, then the offset-length pairs of the exemplary set 164 can identify an offset of "1" and a length of "3", an offset of "1" and a length of "4", an offset of "1" and a length of "5", and so on until sixteen such symbols are enumerated within the exemplary set 164.

In a similar manner, the exemplary set 165 can comprise symbols identifying offset-length pairs whose offset is either "2" or "3", depending on whether the "1" additional bit to be read is a "0" or a "1". Thus, for example, staying with the above example that the exemplary data compression shown by the exemplary system 100 of FIG. 1 utilizes a minimum length of three bits, the symbols of the exemplary set 165 can comprise sixteen symbols with offsets of "2", starting with lengths of "3", namely: an offset of "2" and a length of "3", an offset of "2" and a length of "4", an offset of "2" and a length of "5", and so on until sixteen such symbols are enumerated. Additionally, the exemplary set 165 can further comprise sixteen symbols with offsets of "3", starting with lengths of "3", namely: an offset of "3" and a length of "3", an offset of "3" and a length of "4", an offset of "3" and a length of "5", and so on until sixteen such symbols are enumerated. Other like sets of symbols can also be part of the exemplary alphabet 160, including a set that can comprise the symbol 133 that represents an offset of "10" and a length of "6".

Additionally, the exemplary alphabet 160 can further comprise sets of symbols that can identify equivalent sequences of bits, such as the sequences of bits 121 and 122, in other manners, such as may be more efficient at identifying previously occurring sequences of bits. For example, the exemplary set 162 can identify previously occurring sequences of bits based on offset-length pairs that are within a Move-To-Front (MTF) buffer, with the symbols within the exemplary set 162 identifying offset-length pairs within the MTF buffer. Other like sets can likewise comprise exemplary alphabet 160.

Returning to the exemplary data compression illustrated by the exemplary system 100 of FIG. 1, the replacing of defined portions of the exemplary data 110 with symbols from the exemplary alphabet 160, such as that detailed above, can be referred to as "string matching". Such string matching can transform the exemplary digital data 110 into symbol-encoded digital data, such as the exemplary symbol-encoded digital data 130. Subsequently, a frequency encoding, such as the exemplary frequency encoding 140 can be performed on the symbol-encoded data 130 to generate compressed digital data, such as the exemplary compressed digital data 150. As will be recognized by those skilled in the art, frequency encoding, such as the exemplary frequency encoding 140, can replace the symbols within the symbol encoded data 130 with shorthand versions thereof. More specifically, frequency encoding, such as the exemplary frequency encoding 140, can determine the frequency with which the symbols of the exemplary alphabet 160 occur within the symbol-encoded data 130. Subsequently, the frequency encoding 140 can replace, in the symbol-encoded data 130, symbols, of the exemplary alphabet 160, with sequences of bits that can represent those symbols. The sequences of bits can be selected based upon the determined frequency of occurrence, with fewer quantities of bits being utilized to represent those symbols that occur more frequently. In such a manner, because those symbols of the exemplary alphabet 160 that occur most frequently in the symbol-encoded data 130 are being replaced with sequences of bits that are substantially shorter, the quantity of bits in the compressed data 150 can be less than the quantity of bits in the symbol-encoded data 130, which, in turn, due to the replacing of sequences of bits with references to prior instances of those sequences of bits, can itself comprise if you are quantity of bits than the original data 110. In such a manner, the data 110 can be compressed into the compressed data 150, thereby representing the same data, without loss, except in a smaller size, namely a smaller quantity of bits.

To enable a decompressor to extract the symbol-encoded data 130 from the compressed data 150, in order to subsequently re-create the data 110 from the symbol-encoded data 130 and thereby decompress the compressed data 150 back into the data 110, the compressed data 150 can comprise one or more headers, such as the exemplary header 151, that can identify the symbols of the alphabet that was utilized, such as the exemplary alphabet 160, as well as provide the key that defines the association between those symbols and the corresponding sequence of bits utilized by the frequency encoding 140 to represent those symbols in the compressed data 150.

Consequently, the size of the compressed data 150 can be dependent upon the symbols of the exemplary alphabet 160, both in whether the alphabet 160 comprises symbols that enable the representation of the data 110 in the symbol-encoded data 130 in a space-saving manner, and also in whether the alphabet 160 comprises too many symbols such that the resulting headers of the compressed data 150, such as the exemplary header 151, are larger than they need to be in order to provide a key correlating each of the symbols of the alphabet 162 the sequences of bits utilized by the frequency encoding 140 to represent such symbols.

Although the exemplary alphabet 160 is illustrated as a single hierarchical level, alphabets can comprise multiple hierarchical levels, with so-called "short symbols" comprising a highest hierarchical level and the so-called "long symbols" comprising lower hierarchical levels. More specifically, a "short symbol" can be defined to require reference to another hierarchical level, in other words to a "long symbol" in order to completely represent an offset-length pair, where one of the offset or the length is larger than what is represented by other "short symbols". The utilization of such hierarchical levels can reduce the size of one or more of the headers of the compressed data 150, such as the exemplary header 151, in that only the topmost hierarchical level of an alphabet may need to be represented in such headers as part of the frequency encoding 140.

An alphabet, such as the exemplary alphabet 160, is selected as part of the development of a compression algorithm. In other words, modern compression algorithms utilize a single unchanging alphabet such that subsequent decompression of compressed data can be performed only by knowing which compression algorithm was utilized, since each compression algorithm utilizes only a single alphabet.

According to one aspect, an alphabet to be utilized to compress digital data, such as in accordance with the compression mechanisms described above and illustrated by the exemplary system 100 of FIG. 1, can be selected based on the data in order to achieve higher compression ratios, more efficient compression, or other like benefits. For example, if the buffer 120 is sized so that it is only 4 KB, for example, then the exemplary alphabet 160 need not comprise symbols that are representative of offset-length pairs whose offsets are greater than 4 KB, since the size of the buffer 120 prevents such offsets from ever being detected. The inclusion, within the alphabet 160, of symbols representative of offset-length pairs whose offsets are greater than 4 KB simply results in larger headers, such as the exemplary header 151, in the compressed data 150, thereby increasing the size of the compressed data 150 in decreasing the compression ratio achieved by the compression algorithm, without any attendant benefit since, again, such symbols represent offset-length pairs whose offsets cannot occur due to the size of the buffer 120. As another example, if the data 110 is textual data conforming to the ASCII character representation format, and only comprises letters and numbers, then many of the ASCII character representations needs not to be represented in the set of literals 161 of the alphabet 160, since they do not occur within the exemplary data 110. Again, the inclusion, within the alphabet 160, of such literals can increase the ultimate size of the compressed data 150 without any attendant benefit. Accordingly, selecting an alphabet, such as the exemplary alphabet 160, in accordance with the data 110 and other compression parameters, such as, for example, the size of the buffer 120, can beneficially improve compression ratios, efficiency, and other like computational improvements.

Figure 2:
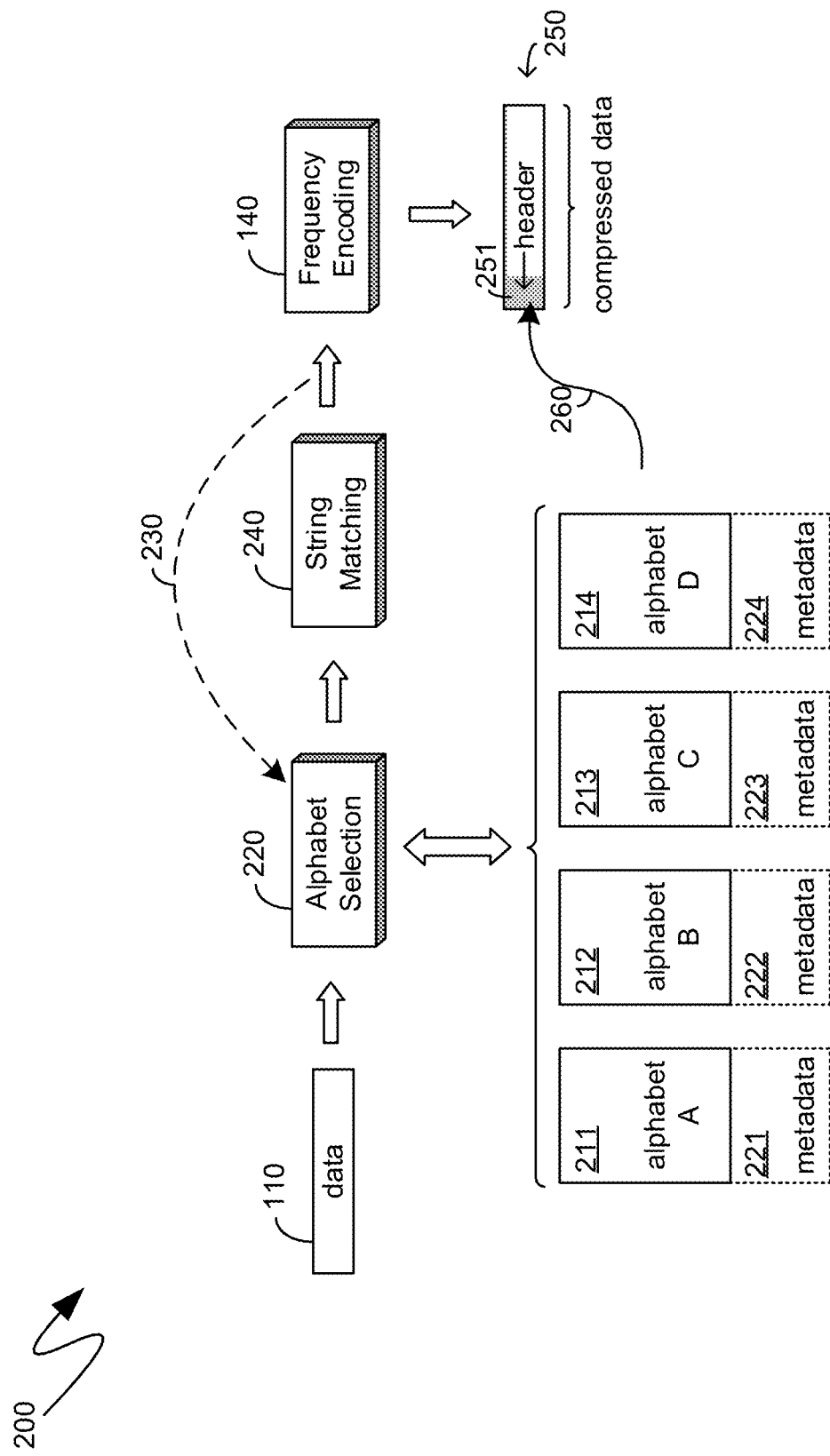
FIG. 2 is a system diagram of an exemplary alphabet selection data compression system.

Turning to FIG. 2, the exemplary system 200 shown therein illustrates an exemplary compression mechanism implemented by the exemplary system 200 that provides for the selection of an alphabet, from among multiple pre-existing alphabets, such as the exemplary alphabets 211, 212, 213 and 214. More specifically, data to be compressed, such as the exemplary data 110, can inform an alphabet selection, such as the exemplary alphabet selection 220. Once an alphabet is selected, the exemplary data 110 can have string matching performed thereon, such as by the exemplary string matching 240, generating a symbol-encoded data, such as that described previously. The symbol encoded data can then be frequency encoded, such as by the exemplary frequency encoding 140, to generate the compressed data 250. The compressed data 250 can comprise one or more headers, such as the exemplary header 251, which can, in the manner detailed previously, include information regarding the selected alphabet, as illustrated by the arrow 260.

The various alphabets, from which the alphabet selection 220 can choose, can be pre-generated based on particular data types, compression parameters, and other like considerations that can then be enumerated in metadata associated with each of the alphabets. For example, the exemplary alphabet 211 can comprise a set of literals that only include the ASCII bit sequences for letters and numbers, while, as another example, the exemplary alphabet 212 can comprise a set of literals that include all of the ASCII bit sequences. Correspondingly, the metadata 221, associated with the alphabet 211, can identify that the alphabet 211 comprises a set of literals that only include ASCII bit sequences for letters and numbers, while the metadata 222, associated with the alphabet 212, can identify that the alphabet 212 comprises a set of literals that include all of the ASCII bit sequences. Thus, if the alphabet selection 220 determines, or is informed, such as by a user, that the data 110 is textual data that comprises only letters and numbers, the alphabet selection 220 can, with reference to the metadata 221, determine that the alphabet 211 is more appropriate for that data then, for example, the alphabet 212.

As another example, the exemplary alphabet 213 can comprise sets of symbols representing offset-length pairs whose offsets are not greater than 2 KB, for example, while, as another example, the exemplary alphabets 214 can comprise sets of symbols representing offset-length pairs whose offsets include offsets up to 4 KB in size. Again, the metadata 223 and 224 associated with the exemplary alphabets 213 and 214, respectively, can include information indicative of such offset sizing that is represented by the sets of symbols in those alphabets. Consequently, if the alphabet selection 220 determines, or is informed, such as by a user, that the data 110 is, for example, smaller than 2 KB, or that the compression of the data 110 will use a buffer that is smaller than 2 KB, then the alphabet selection 220 can select the exemplary alphabet 213, since there is no need for the additional symbols, representing offset-length pairs whose offsets are greater than 2 KB, which are present in the alphabet 214 in the above example.

According to one aspect, as illustrated by the dashed arrow 230, an analysis of the data 110 can be based on preliminary string matching performed on portions of the data 110 utilizing different ones of the alphabets from which the alphabet selection 220 can choose. In a simplest form, the string matching 240 and subsequent frequency encoding 140 can be performed utilizing multiple ones of the alphabets from which the alphabet selection 220 can choose and the alphabet selection 220 can base its choice by comparing the size of the resulting compressed data, such as the exemplary compressed data 250 when the data 110 was compressed utilizing each of the alphabets. For example, the alphabet selection 220 can select the alphabet which resulted in the smallest compressed data size. As another example, the alphabet selection 220 can select the alphabet which resulted in the generation of the compressed data, such as the exemplary compressed data 250, in the least amount of time, or resulted in the generation of compressed data that meets certain thresholds within the least amount of time. Other combinations of such considerations can likewise be taken into account by the alphabet selection 220.

Compressing all of the data 110 multiple times utilizing different ones of the alphabets can be efficient if the data 110 is representative of subsequent data for which the alphabet selection 224 the data 110 can be equally applied to such subsequent data. For example, if the data 110 was one of many text-based files that are to be compressed, then compressing the data 110 multiple times, utilizing different ones of the alphabets, can be efficient because the ultimate selection of an alphabet can then be applied without further reevaluation of such a selection to other ones of the text-based files.

However, in other instances, compressing all of the data 110 multiple times can be inefficient. Consequently, according to one aspect, only a portion of the data 110 can be string matched, such as by the string matching 240, utilizing multiple different ones of the alphabets that are available to be selected by the alphabet selection 220. The alphabet selection 220 can then be informed by such string matching, as illustrated by the arrow 230. More specifically, the symbols of the alphabets utilized by the string matching 240 when string matching a portion of the data 110 can be evaluated, such as by the alphabet selection 220 and utilized to inform a selection of one of the alphabets. For example, the alphabet selection 220 can select the smallest alphabet that still comprises all of the symbols utilized in the string matching the portion of the data 110. As another example, the alphabet selection 220 can select an alphabet that still comprises all of the symbols that are utilized above a threshold amount of times, or above a threshold frequency, when performing the string matching on the portion of the data 110.

The alphabet selection 220 can also receive input from an initial portion of the frequency encoding 140. More specifically, the frequency encoding 140, as detailed above, can generate shorthand versions, comprising shorter sequences of bits, that represent the symbols utilized by the string matching 240 in generating the symbol-encoded data from the portion of the data 110 that is string matched. As also detailed above, symbols that are used more frequently can be represented by shorter sequences of bits than symbols that are utilized more often. Thus, for a larger alphabet, having more symbols, any one of which is not utilized very often, the resulting frequency encoding can assign more shorthand sequences of bits that have greater quantities of bits, because a larger quantity of symbols of the alphabet are utilized infrequently. Thus, the alphabet selection 220 can be informed by the size, or quantity of bits, utilized by the shorthand assigned by the frequency encoding to represent the symbols of the alphabet. For example, the alphabet selection 220 can select the alphabet whose symbols are represented by the frequency encoding in the most compact manner, or, stated differently, that the shorthand representations of the symbols of the alphabet, in aggregate, comprise the least quantity of bits.

The alphabet selection 220 can, in some instances, receive input from the data 110 itself, without performing any string matching or an initial portion of the frequency encoding. For example, if the data 110 is textual data conforming to the ASCII character representation format, and only comprises letters and numbers, then as indicated previously, an alphabet can be selected, such as by the alphabet selection 220, that does not include, within its literals, those ASCII character representations of anything other than letters and numbers. The identification of the data 110 as, for example, being ASCII textual data that comprises only letters and numbers can be made without reference to the string matching 240 or any part of the frequency encoding 140, and can, instead, be based on an examination of the data 110 itself, such as by evaluating one or more headers of the data 110, a file type of the data 110, operating system metadata applicable to the data 110, or other like examination of the data. In such an instance, the alphabet selection 220 can select an alphabet directly based on such an examination of the data 110.

Once an alphabet is selected by the alphabet selection 220, the data 110 can first be string matched, by the string matching 240, utilizing the alphabet selected by the alphabet selection 220. The resulting symbol-encoded data can then be frequency encoded, by the frequency encoding 140, resulting in a compressed version of the data 110, namely the compressed data 250. The compressed data 250 can comprise one or more headers, such as the exemplary header 251, which can contain a specification of the alphabet selected by the alphabet selection 220, as illustrated by the arrow 260. Subsequently, a decompressor can have access to the same alphabets as the alphabet selection 220 such that, upon detecting the specification of the alphabet in the header of a compressed data, such as the exemplary header 251 of the exemplary compressed data 250, the decompressor can utilize the specified alphabet to decompress the compressed data 250 into a new copy of the data 110.

In some instances, data to be compressed can have a sufficiently entropy that no available pre-existing alphabet, available to the exemplary alphabet selection 220, can meaningfully compress such data utilizing run-length encoding, such as that detailed above in connection with FIG. 1. In such instances, the alphabet selection 220 can select an alphabet, or an alphabet can be dynamically generated, such as will be detailed below, that comprises only literals and does not comprise symbols representing offset-length pairs, since such pairs may not be useful for high-entropy data.

Figure 3:
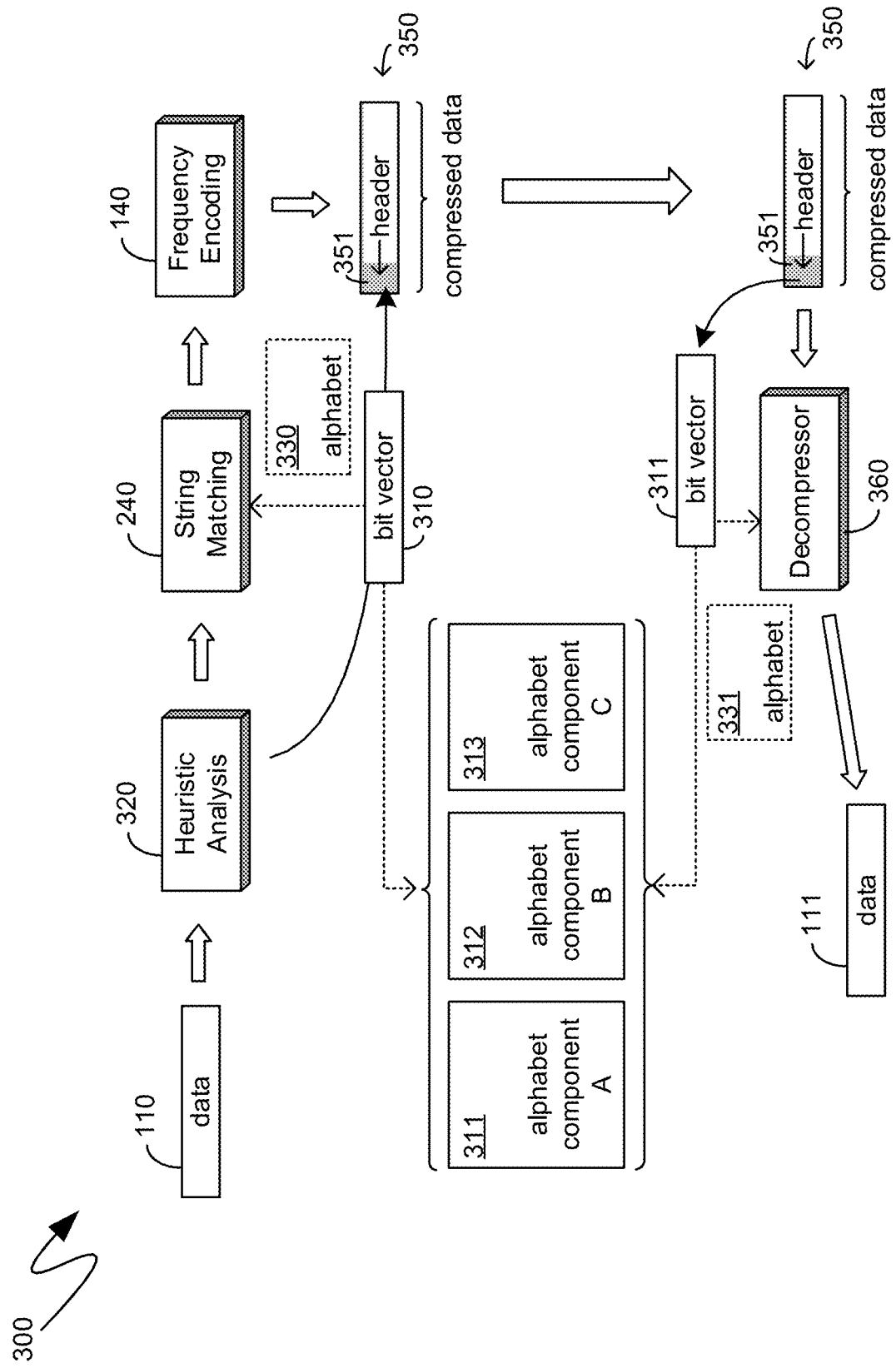
FIG. 3 is a system diagram of an exemplary alphabet generation data compression system.

According to another aspect, rather than selecting from pre-existing alphabets, data can be compressed by alphabet that can be dynamically generated, such as from discrete alphabet components, such as discrete sets of symbols, or even constructed by assembling individual symbols. Turning to FIG. 3, the exemplary system 300 shown therein illustrates an exemplary compression of digital data utilizing a constructed alphabet, which can be constructed based on the digital data being compressed. More specifically, the data being compressed, such as the exemplary data 110, can be analyzed, such as by a heuristic analysis 320. The heuristic analysis 320 can detect various aspects of the data 110 such as, for example, a size of the data, a type of the data, such as, for example, whether the data is textual and, if it is, whether specific sets of characters are utilized, and other like aspects of the data. Additionally, the heuristic analysis 320 can detect other relevant aspects, such as a size of the buffer, or other like compression attributes. The heuristic analysis 320 can encode such information into a bit vector, such as the exemplary bit vector 310, which can be stored as part of one or more headers of the resulting compressed data, such as the exemplary header 351 of the compressed data 350. More specifically, the bit vector can comprise binary values indicating the presence, or absence, respectively, of certain factors or attributes. For example, a first dimension of the bit vector can indicate whether or not the data 110 comprises only letters and numbers, a second dimension of the bit vector can indicate whether or not the data 110 is smaller than, for example, 2 KB, a third dimension of the bit vector can indicate whether or not a buffer size utilized for the compression of the data 110 is smaller than, for example, 2 KB, and so on.

The bit vector 310 can comprise many dimensions, and an alphabet can be constructed in accordance with the bit values assigned to those dimensions by the heuristic analysis 320. For example, the exemplary alphabet component 311 can comprise one or more sets of symbols that represent offset-length pairs where the offset is between 1 bit and 2 KB, the exemplary alphabet component 312 can comprise one or more sets of symbols where the offset is between 2 KB and 4 KB, the exemplary alphabet component 313 can comprise one or more sets of symbols where the offset is between 4 KB and 8 KB and so on. Analogously, the bit vector 310 can comprise a first dimension that identifies whether the size of the data 110 is greater than 2 KB, a second dimension that identifies whether the size of the data 110 is greater than 4 KB, and so on. Consequently, a value of "1" in the first dimension and "0" in the second dimension can correspond to data whose size would not allow offsets of the more than 4 KB. The exemplary alphabet that can be constructed for the compression of such data can include, for example, the alphabet components 311 and 312, but can exclude the alphabet component 313. Thus, the values of the dimensions of the vector 310 can, either directly or indirectly, inform which alphabet components are included in the alphabet to be utilized for the compression of the data 110, and which alphabet components are to be excluded.

An alphabet, such as the exemplary alphabet 330, can be generated in the manner described above by including those alphabet components, comprising multiple symbols or sets of symbols, or even by building the alphabet symbol by symbol. The exemplary alphabet 330 can then be utilized to string match the data 110, such as by the string matching 240, which can generate symbol-encoded data that can then be provided to the frequency encoding 140, which can frequency encode the symbol-encoded data, resulting in a compressed version of the data 110, namely the compressed data 350. The compressed data 350 can comprise one or more headers, such as the exemplary header 351, which can contain the bit vector 310 in addition to the information detailed previously, such as an enumeration of the symbols of the alphabet 330 that was utilized, and their corresponding shorthand representations assigned by the frequency coding 140.

Once the compressed data 350 is provided to a decompressor, such as the exemplary decompressor 360, the decompressor 360 can retrieve, from the one or more headers 351, the bit vector 310, illustrated as the bit vector 311 in the system of FIG. 3 to represent that it is a different copy of the bit vector 310. The decompressor can then independently generate the same alphabet 330, illustrated in FIG. 3 as the alphabet 331 to signify that it is independently generated and separate from the alphabet 330. More specifically, the decompressor 360 can utilize the information in the bit vector 311 to apply the same alphabet construction criteria that was applied by the heuristic analysis 320 to generate the alphabet 330. Thus, the decompressor 360 can independently generate the alphabet 331, such as from the alphabet components 311, 312 and 313, which can then enable the decompressor 360 to decompress the compressed data 350 into the data 311, which can be another copy of the original data 310.

Figure 4:
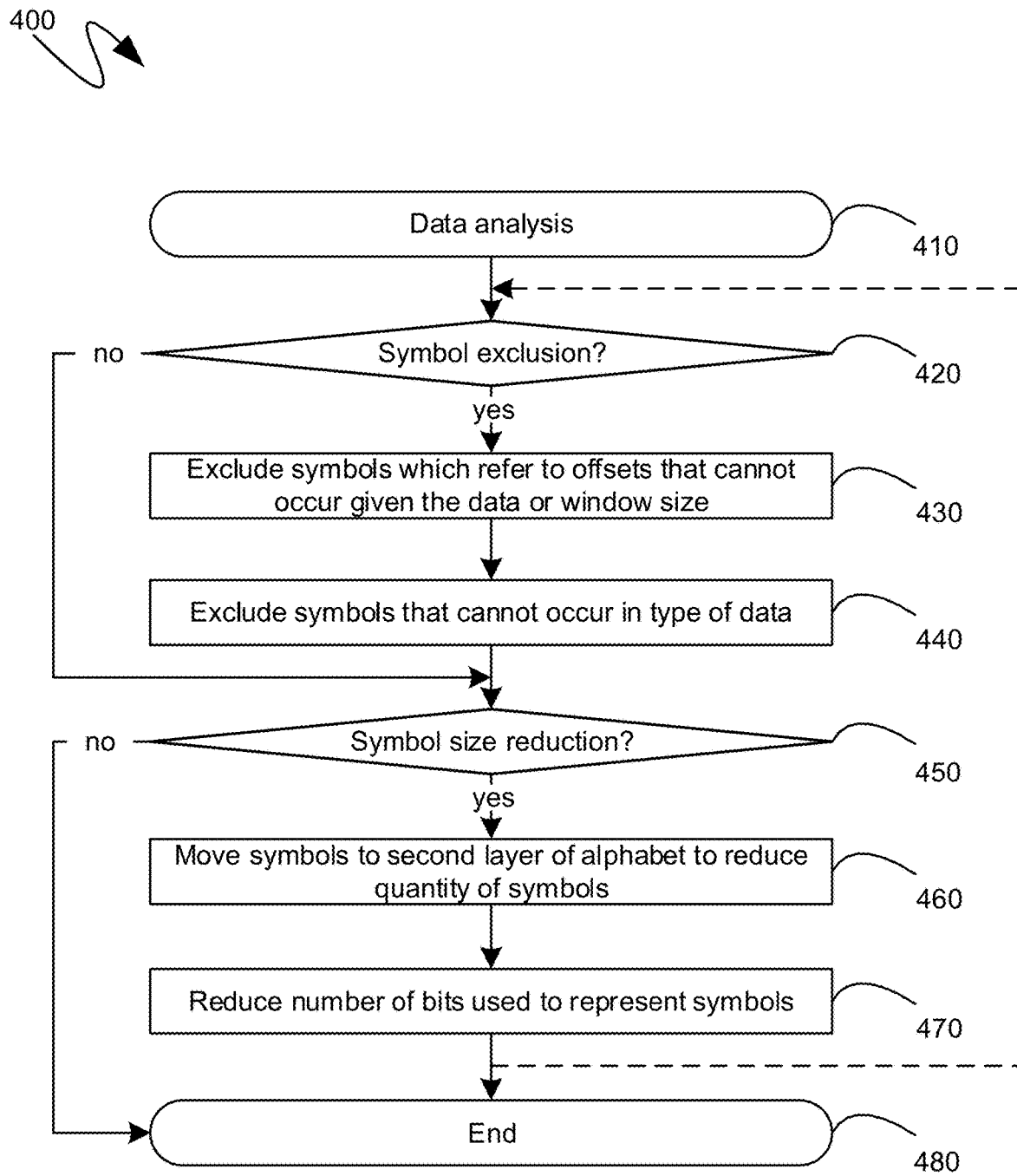
FIG. 4 is a flow diagram of an exemplary alphabet generation data compression mechanism.

Rather than constructing an alphabet from scratch, such as by assembling individual alphabet components, or even individual symbols, and alphabet can also be constructed, such as by the heuristic analysis 320 by starting with an initial, or seed, alphabet and then removing symbols or sets of symbols that are unnecessary given the heuristic analysis of the data 110. Turning to FIG. 4, the exemplary flow diagram 400 shown therein illustrates an exemplary series of steps by which an alphabet can be generated by removing, or excluding, symbols, or sets of symbols, from an initial alphabet based on the data 110, compression parameters, or other like information. Initially, as illustrated in FIG. 4, at step 410, the data to be compressed can be analyzed. Based on the analysis of step 410, determinations 420 and 450 can be made. Although illustrated sequentially in the exemplary flow diagram 400 of FIG. 4, determinations 420 and 450 can be performed in either order, or in parallel. Additionally, as illustrated by the dashed line, determinations 420 and/or 450 can be performed multiple times in the context of multiple iterations through the steps of the exemplary flow diagram 400. Determination 420 can determine whether symbols from the initial alphabet can be removed based on the data analysis at step 410, while determination 450 can determine whether the size, such as in bits, of the shorthand assigned by the frequency analysis to represent the symbols of the alphabet can be reduced.

If, at step 420, the data analysis of step 410 reveals that symbols of the initial alphabet can be excluded, then processing can proceed to steps 430 and 440. At step 430, symbols that represent offset-length pairs having offsets that cannot occur due to the size of the data or the size of the buffer window, can be excluded. Similarly, at step 440, symbols that cannot occur in the type of data such as, for example, ASCII codes of textual elements that are not utilized in the data, as determined by the data analysis 410, can, likewise, be excluded.

If, at step 450, the data analysis of step 410 reveals that the shorthand that will be applied to symbols, such as by a frequency encoding, can be reduced, processing can proceed to steps 460 and 470. At step 460, symbols of the initial alphabet, rather than being excluded from the alphabet as a whole, can be removed from a highest, or topmost, hierarchical layer and can be, instead, represented by existing symbols in combination with symbols in lower hierarchical layers. At step 470, the quantity of bits utilized to represent the symbols of the alphabet, even prior to a frequency encoding, can be reduced if a quantity of symbols within the alphabet is itself reduced. For example, if the initial alphabet comprises more than 512 different symbols, each symbol can be uniquely identified by ten bits of data. By contrast, if a sufficient quantity of symbols is removed from the initial alphabet, such that the generated alphabet comprises less than 512 symbols, then only nine bits of data need to be utilized to represent each of the symbols.

Once the initial alphabet is modified, such as in the manner described above, the relevant processing can end at step 480.

Figure 5:
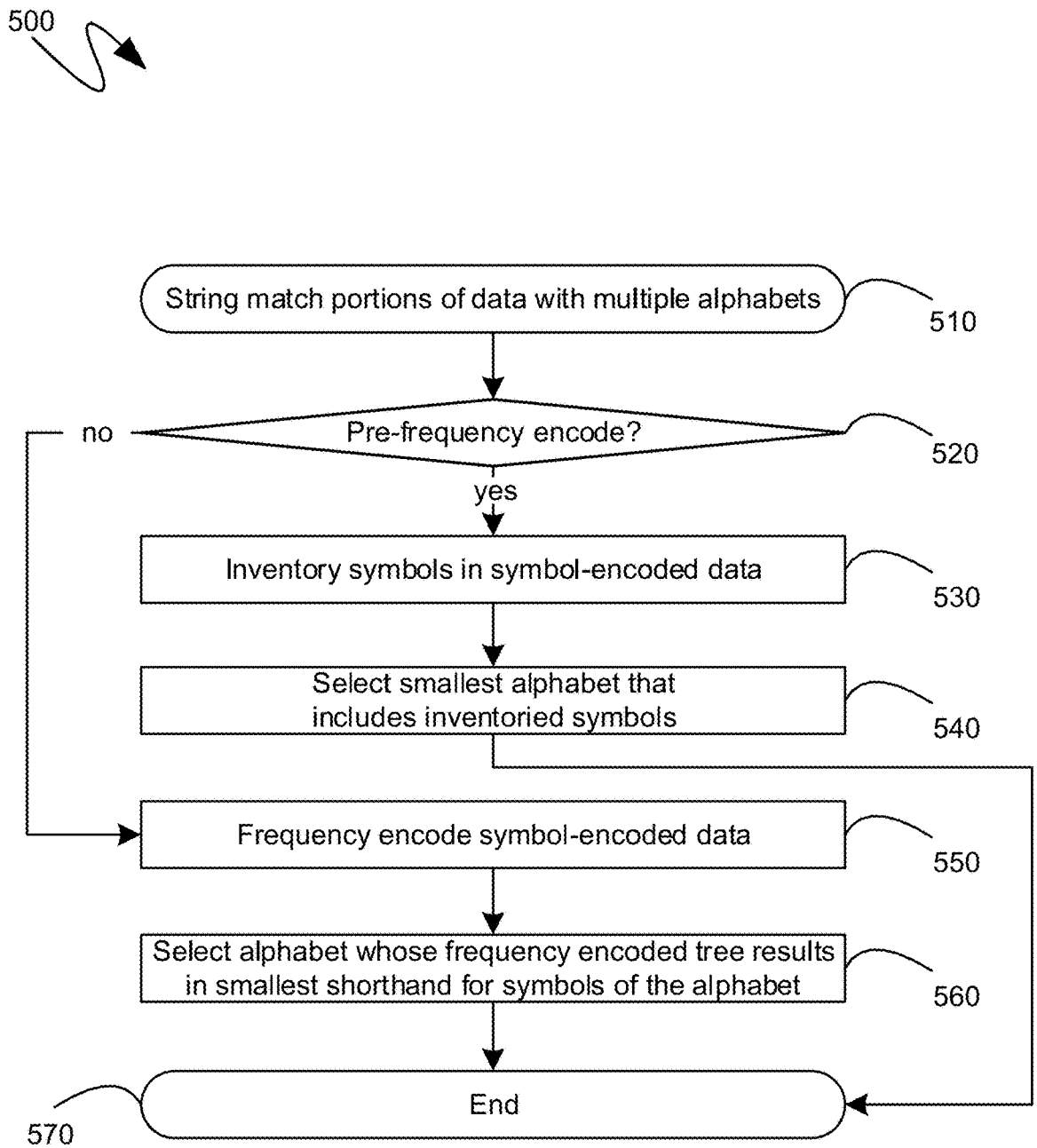
FIG. 5 is a flow diagram of an exemplary alphabet selection data compression mechanism.

Turning to FIG. 5, the exemplary flow diagram 500 shown therein illustrates an exemplary series of steps by which an alphabet can be selected, from among multiple already existing alphabets, based on string matching performed on at least a portion of the data to be compressed utilizing the multiple alphabets. Initially, at step 510, portions of the data to be compressed can be string matched utilizing multiple different alphabets. At step 520, a determination can be made whether to select an alphabet prior to frequency encoding any of the symbol-encoded data generated by step 510. If, at step 520, is determined that frequency encoding need not be performed, processing can proceed to steps 530 and 542 select an alphabet without performing frequency encoding. At step 530, symbols of a given alphabet that are utilized in the symbol-encoded data generated by string matching a portion of the data with that alphabet, can be inventoried or counted. Subsequently, at step 540 a smallest alphabet can be selected that includes the inventoried symbols. The relevant processing can then end at step 570.

Conversely, if, at step 520 is determined that frequency encoding will be performed on the symbol-encoded data generated at step 510 when portions of the data to be compressed are string matched with multiple alphabets, then processing can proceed to steps 550 and 560. At step 550, the symbol-encoded data generated at step 510 can be frequency encoded, such as in the manner detailed previously. Subsequently, at step 560, an alphabet whose frequency encoded tree results in the smallest shorthand for the symbols of the alphabet, can be selected. In other words, at step 560, an aggregation of the quantity of bits utilized to represent each of the symbols of the alphabet, in the shorthand generated by the frequency encoding, can be identified and the selection of the alphabet can be based on whichever alphabet resulted in the smallest aggregated quantity of bits. The relevant processing can then end at step 570.

Figure 6:
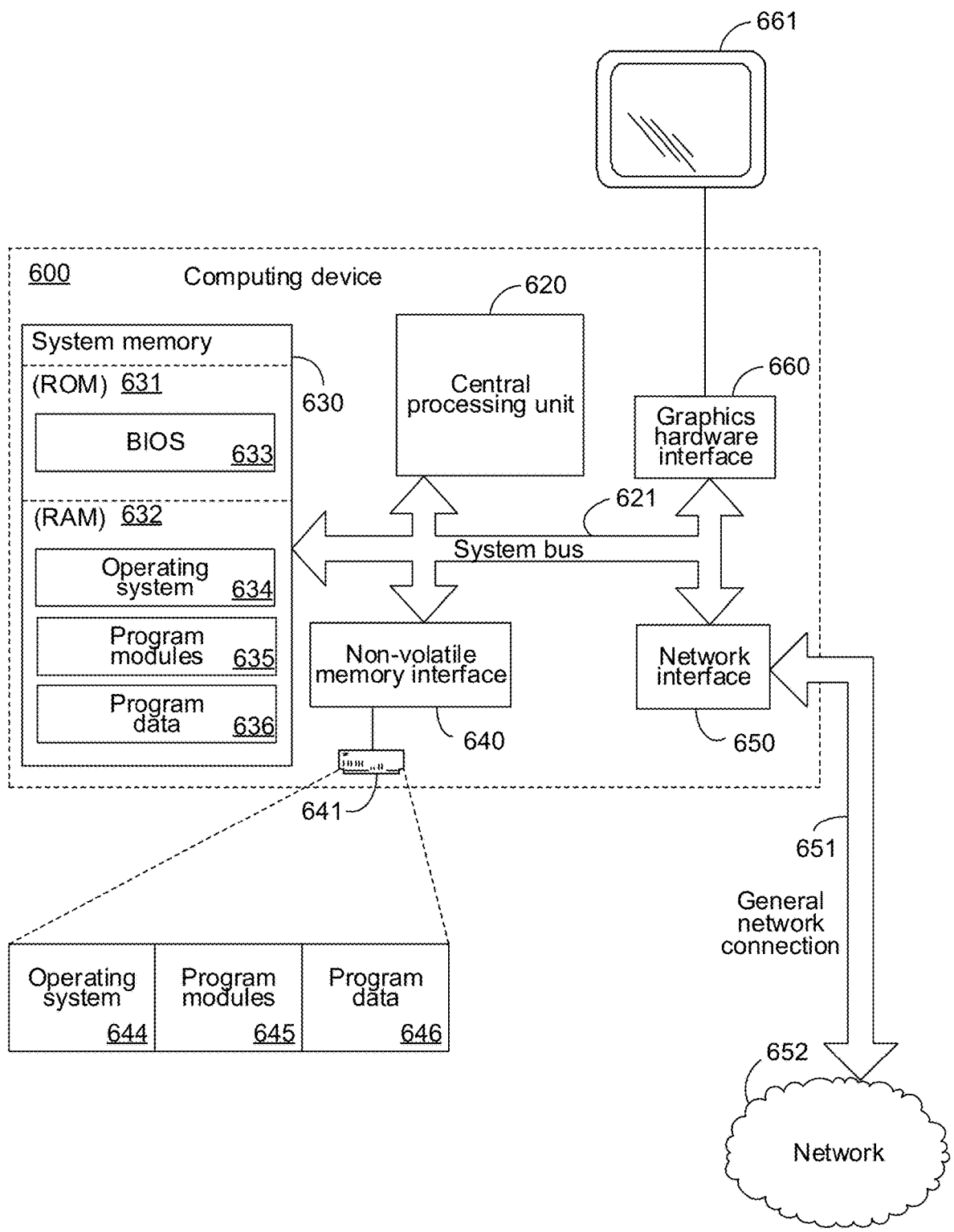
FIG. 6 is a block diagram of an exemplary computing device.

Turning to FIG. 6, an exemplary computing device 600 is illustrated which can perform some or all of the mechanisms and actions described above. The exemplary computing device 600 can include, but is not limited to, one or more central processing units (CPUs) 620, a system memory 630, and a system bus 621 that couples various system components including the system memory to the processing unit 620. The system bus 621 may be any of several types of bus structures including a memory bus or memory controller, a peripheral bus, and a local bus using any of a variety of bus architectures. The computing device 600 can optionally include graphics hardware, including, but not limited to, a graphics hardware interface 660 and a display device 661, which can include display devices capable of receiving touch-based user input, such as a touch-sensitive, or multi-touch capable, display device. Depending on the specific physical implementation, one or more of the CPUs 620, the system memory 630 and other components of the computing device 600 can be physically co-located, such as on a single chip. In such a case, some or all of the system bus 621 can be nothing more than silicon pathways within a single chip structure and its illustration in FIG. 6 can be nothing more than notational convenience for the purpose of illustration.

The computing device 600 also typically includes computer readable media, which can include any available media that can be accessed by computing device 600 and includes both volatile and nonvolatile media and removable and non-removable media. By way of example, and not limitation, computer readable media may comprise computer storage media and communication media. Computer storage media includes media implemented in any method or technology for storage of content such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired content and which can be accessed by the computing device 600. Computer storage media, however, does not include communication media. Communication media typically embodies computer readable instructions, data structures, program modules or other data in a modulated data signal such as a carrier wave or other transport mechanism and includes any content delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 630 includes computer storage media in the form of volatile and/or nonvolatile memory such as read only memory (ROM) 631 and random access memory (RAM) 632. A basic input/output system 633 (BIOS), containing the basic routines that help to transfer content between elements within computing device 600, such as during start-up, is typically stored in ROM 631. RAM 632 typically contains data and/or program modules that are immediately accessible to and/or presently being operated on by processing unit 620. By way of example, and not limitation, FIG. 6 illustrates operating system 634, other program modules 635, and program data 636.

The computing device 600 may also include other removable/non-removable, volatile/nonvolatile computer storage media. By way of example only, FIG. 6 illustrates a hard disk drive 641 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media as defined and delineated above. The hard disk drive 641 is typically connected to the system bus 621 through a non-volatile memory interface such as interface 640.

The drives and their associated computer storage media discussed above and illustrated in FIG. 6, provide storage of computer readable instructions, data structures, program modules and other data for the computing device 600. In FIG. 6, for example, hard disk drive 641 is illustrated as storing operating system 644, other program modules 645, and program data 646. Note that these components can either be the same as or different from operating system 634, other program modules 635 and program data 636. Operating system 644, other program modules 645 and program data 646 are given different numbers hereto illustrate that, at a minimum, they are different copies.

The computing device 600 may operate in a networked environment using logical connections to one or more remote computers. The computing device 600 is illustrated as being connected to the general network connection 651 (to a network 652) through a network interface or adapter 650, which is, in turn, connected to the system bus 621. In a networked environment, program modules depicted relative to the computing device 600, or portions or peripherals thereof, may be stored in the memory of one or more other computing devices that are communicatively coupled to the computing device 600 through the general network connection 661. It will be appreciated that the network connections shown are exemplary and other means of establishing a communications link between computing devices may be used.

Although described as a single physical device, the exemplary computing device 600 can be a virtual computing device, in which case the functionality of the above-described physical components, such as the CPU 620, the system memory 630, the network interface 660, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where the exemplary computing device 600 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. The term "computing device", therefore, as utilized herein, means either a physical computing device or a virtualized computing environment, including a virtual computing device, within which computer-executable instructions can be executed in a manner consistent with their execution by a physical computing device. Similarly, terms referring to physical components of the computing device, as utilized herein, mean either those physical components or virtualizations thereof performing the same or equivalent functions.

The descriptions above include, as a first example a method for compressing digital data on a computing device, the method comprising: selecting, from among multiple alphabets, an alphabet with which to generate a symbol-encoded digital data from the digital data; generating the symbol-encoded digital data from the digital data by performing string matching on the digital data utilizing the selected alphabet; and generating a compressed version of the digital data by performing frequency matching on the symbol-encoded digital data; wherein the selecting the alphabet comprises: performing a first string matching on at least a portion of the digital data utilizing a first alphabet, from among the multiple alphabets, the first alphabet comprising a first set of symbols, each representing one of a first set of discrete pre-defined sequences of bits, the first alphabet also comprising a second set of symbols, each representing an offset-length pair from among a first set of offset-length pairs, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; performing, a second string matching on the at least the portion of the digital data utilizing a second alphabet, from among the multiple alphabets, the second alphabet comprising a third set of symbols, each representing one of a second set of discrete pre-defined sequences of bits that differs from the first set of discrete pre-defined sequences of bits, the second alphabet also comprising a fourth set of symbols, each representing an offset-length pair from among a second set of offset-length pairs that differs from the first set of offset-length pairs; and selecting, as the selected alphabet, one of the first alphabet or the second alphabet, the selecting being based on the first string matching and the second string matching.

A second example is the method of the first example, wherein the selecting the one of the first alphabet or the second alphabet comprises: determining a quantity of unused symbols of the first alphabet that were not utilized in performing the first string matching; determining a quantity of unused symbols of the second alphabet that were not utilized in performing the second string matching; and selecting, as the selected alphabet, whichever of the first alphabet or the second alphabet have a fewer quantity of unused symbols.

A third example is the method of the second example, wherein the unused symbols of the first alphabet comprise symbols of the second set of symbols that represent offset-length pairs that cannot occur due to either a size of the digital data or a size of a search window utilized in performing the string matching on the digital data; and wherein further the unused symbols of the second alphabet comprise symbols of the fourth set of symbols that represent offset-length pairs that cannot occur due to either the size of the digital data or the size of the search window utilized in performing the string matching on the digital data.

A fourth example is the method of the second example, wherein the unused symbols of the first alphabet comprise symbols of the first set of symbols that represent discrete pre-defined sequences of bits that cannot occur due to a type of the digital data; and wherein further the unused symbols of the second alphabet comprise symbols of the third set of symbols that represent discrete pre-defined sequences of bits that cannot occur due to the type of the digital data.

A fifth example is the method of the first example, wherein the selecting the one of the first alphabet or the second alphabet comprises: performing a first frequency matching on an output of the first string matching, the first frequency matching comprising generating a first set of shorthand codes for symbols of the first alphabet; determining a length of the shorthand codes of the first set of shorthand codes; performing a second frequency matching on an output of the second string matching, the second frequency matching comprising generating a second set of shorthand codes for symbols of the second alphabet; determining a length of the shorthand codes of the second set of shorthand codes; and selecting, as the selected alphabet, whichever of the first alphabet or the second alphabet results in shorthand codes of a shorter length.

A sixth example is the method of the fifth example, wherein the shorthand codes of the first set of shorthand codes are smaller than the shorthand codes of the second set of shorthand codes because a quantity of symbols of the first alphabet that were utilized in performing the first string matching can be represented with a fewer quantity of bits than a quantity of symbols of the second alphabet that were utilized in performing the second string matching.

A seventh example is the method of the first example, wherein the digital data is a single file; and wherein further the compressed version of the digital data comprises one or more headers identifying the selected alphabet.

An eighth example is the method of the first example, wherein the digital data is a portion of a single file, the method further comprising: generating a compressed version of the single file by repeating the selecting, the string matching and the frequency matching for other sets of digital data that are further portions of the single file; wherein each portion of the compressed version of the single file comprises one or more headers identifying a alphabet selected for compressing that portion.

A ninth example is the method of the first example, wherein the second set of discrete pre-defined sequences of bits is a subset of the first set of discrete predefined sequences of bits.

A tenth example is the method of the first example, wherein the second set of offset-length pairs is a subset of the first set of offset-length pairs.

An eleventh example is a method for improving a computing device's compression of digital data, the method comprising: generating, based on the digital data, a alphabet with which to generate a symbol-encoded digital data from the digital data, the generated alphabet comprising a first set of symbols, each representing one of a first set of discrete pre-defined sequences of bits, the generated alphabet also comprising a second set of symbols, each representing an offset-length pair from among a first set of offset-length pairs; generating the symbol-encoded digital data from the digital data by performing string matching on the digital data utilizing the generated alphabet, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; and generating a compressed version of the digital data by performing frequency matching on the symbol-encoded digital data.

A twelfth example is the method of the eleventh example, wherein the generating comprises: determining that the digital data does not comprise any of a second set of discrete pre-defined sequences of bits; and removing, from an original alphabet, a third set of symbols, each representing one of the second set of discrete pre-defined sequences of bits; wherein the generated alphabet is generated from the original alphabet by the removing.

A thirteenth example is the method of the eleventh example, wherein the generating comprises: determining that the digital data does not comprise any of a second set of discrete pre-defined sequences of bits; and adding, to the generated alphabet, only those symbols that represent discrete pre-defined sequences of bits that are not in the second set of discrete pre-defined sequences of bits.

A fourteenth example is the method of the eleventh example, wherein the generating comprises: determining either: (1) that the digital data is sufficiently small that offsets greater than a first offset cannot occur or (2) that the search window for detecting the subsequent instances of the first sequence of bits in the digital data is sufficiently small that the offsets greater than the first offset cannot occur; and removing, from an original alphabet, a third set of symbols, each representing one of a second set of offset-length pairs, each offset-length pair in the second set of offset-length pairs having an offset that is greater than the first offset; wherein the generated alphabet is generated from the original alphabet by the removing.

A fifteenth example is the method of the eleventh example, wherein the generating comprises: determining either: (1) that the digital data is sufficiently small that offsets greater than a first offset cannot occur or (2) that the search window for detecting the subsequent instances of the first sequence of bits in the digital data is sufficiently small that the offsets greater than the first offset cannot occur; and adding, to the generated alphabet, only those symbols that offset-length pairs having an offset that is less than or equal to the first offset.

A sixteenth example is the method of the eleventh example, wherein the compressed version of the digital data comprises one or more headers comprising a bit vector identifying aspects of the digital data on which the generating the alphabet was based.

A seventeenth example is the method of the sixteenth example, further comprising: generating a new copy of the digital data from the compressed version of the digital data, the generating the new copy comprising independently generating the generated alphabet based on the aspects of the digital data identified by the bit vector.

An eighteenth example is one or more computer-readable storage media comprising computer-executable instructions, which, when executed, cause a computing device to: generate, based on digital data to be compressed, an alphabet with which to generate a symbol-encoded digital data from the digital data, the generated alphabet comprising a first set of symbols, each representing one of a first set of discrete pre-defined sequences of bits, the generated alphabet also comprising a second set of symbols, each representing an offset-length pair from among a first set of offset-length pairs; generate the symbol-encoded digital data from the digital data by performing string matching on the digital data utilizing the generated alphabet, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; and generating a compressed version of the digital data by performing frequency matching on the symbol-encoded digital data.

A nineteenth example is the computer-readable storage media of the eighteenth example, wherein the computer-executable instructions for generating the alphabet comprise computer-executable instructions, which, when executed, cause the computing device to: generate the alphabet by selecting one of multiple pre-existing alphabets.

A twentieth example is the computer-readable storage media of the nineteenth example, wherein the computer-executable instructions for selecting the alphabet comprise computer-executable instructions, which, when executed, cause the computing device to: perform a first string matching on at least a portion of the digital data utilizing a first alphabet, from among the multiple pre-existing alphabets, the first alphabet comprising a first set of symbols, each representing one of a first set of discrete pre-defined sequences of bits, the first alphabet also comprising a second set of symbols, each representing an offset-length pair from among a first set of offset-length pairs, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; perform, a second string matching on the at least the portion of the digital data utilizing a second alphabet, from among the multiple pre-existing alphabet, the second alphabet comprising a third set of symbols, each representing one of a second set of discrete pre-defined sequences of bits that differs from the first set of discrete pre-defined sequences of bits, the second alphabet also comprising a fourth set of symbols, each representing an offset-length pair from among a second set of offset-length pairs that differs from the first set of offset-length pairs; and select, as the alphabet, one of the first alphabet or the second alphabet, the selecting being based on the first string matching and the second string matching.

As can be seen from the above descriptions, mechanisms for selecting an alphabet for the compression of digital data at compression time have been presented. In view of the many possible variations of the subject matter described herein, we claim as our invention all such embodiments as may come within the scope of the following claims and equivalents thereto.

We claim:

1. A method for improving a computing device's compression of digital data, the method comprising:
   selecting, from among multiple alphabets, an alphabet with which to generate a symbol- encoded digital data from the digital data;

generating the symbol-encoded digital data from the digital data by performing string matching on the digital data utilizing the selected alphabet; and generating a compressed version of the digital data by performing frequency matching on the symbol-encoded digital data;

wherein the selecting the alphabet comprises:

performing a first string matching on at least a portion of the digital data utilizing a first alphabet, from among the multiple alphabets, the first alphabet comprising a first set of symbols, each representing one of a first set of discrete pre-defined sequences of bits, the first alphabet also comprising a second set of symbols, each representing an offset-length pair from among a first set of offset-length pairs, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits;

performing, a second string matching on the at least the portion of the digital data utilizing a second alphabet, from among the multiple alphabets, the second alphabet comprising a third set of symbols, each representing one of a second set of discrete pre-defined sequences of bits that differs from the first set of discrete pre-defined sequences of bits, the second alphabet also comprising a fourth set of symbols, each representing an offset-length pair from among a second set of offset-length pairs that differs from the first set of offset-length pairs; and selecting, as the selected alphabet, one of the first alphabet or the second alphabet, the selecting being based on the first string matching and the second string matching.

2. The method of claim 1, wherein the selecting the one of the first alphabet or the second alphabet comprises:

determining a quantity of unused symbols of the first alphabet that were not utilized in performing the first string matching;

determining a quantity of unused symbols of the second alphabet that were not utilized in performing the second string matching; and selecting, as the selected alphabet, whichever of the first alphabet or the second alphabet have a fewer quantity of unused symbols.

3. The method of claim 2, wherein the unused symbols of the first alphabet comprise symbols of the second set of symbols that represent offset-length pairs that cannot occur due to either a size of the digital data or a size of a search window utilized in performing the string matching on the digital data; and wherein further the unused symbols of the second alphabet comprise symbols of the fourth set of symbols that represent offset-length pairs that cannot occur due to either the size of the digital data or the size of the search window utilized in performing the string matching on the digital data.

4. The method of claim 2, wherein the unused symbols of the first alphabet comprise symbols of the first set of symbols that represent discrete pre-defined sequences of bits that cannot occur due to a type of the digital data; and wherein further the unused symbols of the second alphabet comprise symbols of the third set of symbols that represent discrete pre-defined sequences of bits that cannot occur due to the type of the digital data.

5. The method of claim 1, wherein the selecting the one of the first alphabet or the second alphabet comprises:

performing a first frequency matching on an output of the first string matching, the first frequency matching comprising generating a first set of shorthand codes for symbols of the first alphabet;

determining a length of the shorthand codes of the first set of shorthand codes;

performing a second frequency matching on an output of the second string matching, the second frequency matching comprising generating a second set of shorthand codes for symbols of the second alphabet;

determining a length of the shorthand codes of the second set of shorthand codes; and selecting, as the selected alphabet, whichever of the first alphabet or the second alphabet results in shorthand codes of a shorter length.

6. The method of claim 5, wherein the shorthand codes of the first set of shorthand codes are smaller than the shorthand codes of the second set of shorthand codes because a quantity of symbols of the first alphabet that were utilized in performing the first string matching can be represented with a fewer quantity of bits than a quantity of symbols of the second alphabet that were utilized in performing the second string matching.

7. The method of claim 1, wherein the digital data is a single file; and wherein further the compressed version of the digital data comprises one or more headers identifying the selected alphabet.

8. The method of claim 1, wherein the digital data is a portion of a single file, the method further comprising:

generating a compressed version of the single file by repeating the selecting, the string matching and the frequency matching for other sets of digital data that are further portions of the single file;

wherein each portion of the compressed version of the single file comprises one or more headers identifying an alphabet selected for compressing that portion.

9. The method of claim 1, wherein the second set of discrete pre-defined sequences of bits is a subset of the first set of discrete predefined sequences of bits.

10. The method of claim 1, wherein the second set of offset-length pairs is a subset of the first set of offset-length pairs.

11. A method for improving a computing device's compression of digital data, the method comprising:

generating, based on the digital data, an alphabet with which to generate a symbol-encoded digital data from the digital data, the generated alphabet comprising a first set of symbols, each representing one of a first set of discrete pre-defined sequences of bits, the generated alphabet also comprising a second set of symbols, each representing an offset-length pair from among a first set of offset-length pairs;

generating the symbol-encoded digital data from the digital data by performing string matching on the digital data utilizing the generated alphabet, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; and generating a compressed version of the digital data by performing frequency matching on the symbol-encoded digital data.

12. The method of claim 11, wherein the generating comprises:
  determining that the digital data does not comprise any of a second set of discrete pre- defined sequences of bits; and
  removing, from an original alphabet, a third set of symbols, each representing one of the second set of discrete pre-defined sequences of bits;
  wherein the generated alphabet is generated from the original alphabet by the removing.

13. The method of claim 11, wherein the generating comprises:
  determining that the digital data does not comprise any of a second set of discrete pre-defined sequences of bits; and
  adding, to the generated alphabet, only those symbols that represent discrete pre-defined sequences of bits that are not in the second set of discrete pre-defined sequences of bits.

14. The method of claim 11, wherein the generating comprises:
  determining either: (1) that the digital data is sufficiently small that offsets greater than a first offset cannot occur or (2) that the search window for detecting the subsequent instances of the first sequence of bits in the digital data is sufficiently small that the offsets greater than the first offset cannot occur; and
  removing, from an original alphabet, a third set of symbols, each representing one of a second set of offset-length pairs, each offset-length pair in the second set of offset-length pairs having an offset that is greater than the first offset;
  wherein the generated alphabet is generated from the original alphabet by the removing.

15. The method of claim 11, wherein the generating comprises:
  determining either: (1) that the digital data is sufficiently small that offsets greater than a first offset cannot occur or (2) that the search window for detecting the subsequent instances of the first sequence of bits in the digital data is sufficiently small that the offsets greater than the first offset cannot occur; and
  adding, to the generated alphabet, only those symbols that offset-length pairs having an offset that is less than or equal to the first offset.

16. The method of claim 11, wherein the compressed version of the digital data comprises one or more headers comprising a bit vector identifying whether or not the digital data itself possesses attributes, each attribute being represented a single bit of the bit vector.

17. The method of claim 16, further comprising:
  generating a new copy of the digital data from the compressed version of the digital data, the generating the new copy comprising independently generating the generated alphabet based on the aspects of the digital data identified by the bit vector.

18. One or more computer-readable storage media comprising computer-executable instructions, which, when executed, cause a computing device to:

generate, based on digital data to be compressed, a alphabet with which to generate a symbol-encoded digital data from the digital data, the generated alphabet comprising a first set of symbols, each representing one of a first set of discrete pre-defined sequences of bits, the generated alphabet also comprising a second set of symbols, each representing an offset-length pair from among a first set of offset-length pairs;

generate the symbol-encoded digital data from the digital data by performing string matching on the digital data utilizing the generated alphabet, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits; and generating a compressed version of the digital data by performing frequency matching on the symbol-encoded digital data.

19. The computer-readable storage media of claim 18, wherein the computer-executable instructions for generating the alphabet comprise computer-executable instructions, which, when executed, cause the computing device to: generate the alphabet by selecting one of multiple pre-existing alphabets.

20. The computer-readable storage media of claim 19, wherein the computer-executable instructions for selecting the alphabet comprise computer-executable instructions, which, when executed, cause the computing device to:
  perform a first string matching on at least a portion of the digital data utilizing a first alphabet, from among the multiple pre-existing alphabets, the first alphabet comprising a first set of symbols, each representing one of a first set of discrete pre-defined sequences of bits, the first alphabet also comprising a second set of symbols, each representing an offset-length pair from among a first set of offset-length pairs, the string matching comprising replacing a first instance of a first sequence of bits in the digital data with a corresponding symbol from the first set of symbols and replacing a subsequent instance of the first sequence of bits in the digital data with a first symbol from the second set of symbols that represents a first offset and a first length, the first offset being how far back in the digital data the first instance of the first sequence of bits occurred, the first length being a length of the first sequence of bits;
  perform, a second string matching on the at least the portion of the digital data utilizing a second alphabet, from among the multiple pre-existing alphabets, the second alphabet comprising a third set of symbols, each representing one of a second set of discrete pre-defined sequences of bits that differs from the first set of discrete pre-defined sequences of bits, the second alphabet also comprising a fourth set of symbols, each representing an offset-length pair from among a second set of offset-length pairs that differs from the first set of offset-length pairs; and
  select, as the alphabet, one of the first alphabet or the second alphabet, the selecting being based on the first string matching and the second string matching.

* * * * *